US006861722B2

(12) United States Patent
Graetzel et al.

(10) Patent No.: US 6,861,722 B2
(45) Date of Patent: Mar. 1, 2005

(54) SOLID STATE HETEROJUNCTION AND SOLID STATE SENSITIZED PHOTOVOLTAIC CELL

(75) Inventors: Michael Graetzel, St-Sulpice (CH); Robert Plass, Versoix (CH); Udo Bach, Ct. Dublin (IE)

(73) Assignee: Ecole Polytechnique Federale de Lausanne, Lausanne (CH)

( * ) Notice: Subject to any disclaimer, the term of this patent is extended or adjusted under 35 U.S.C. 154(b) by 64 days.

(21) Appl. No.: 09/918,115

(22) Filed: Jul. 30, 2001

(65) Prior Publication Data

US 2002/0017656 A1 Feb. 14, 2002

(30) Foreign Application Priority Data

Jul. 28, 2000 (EP) .............................................. 00810681

(51) Int. Cl.[7] .......................... H01L 31/06; H01L 29/06; H01L 31/0328; H01L 31/0336; H01L 31/072
(52) U.S. Cl. .......................... 257/461; 257/21; 257/184; 257/431; 257/436
(58) Field of Search ................................. 257/436, 461, 257/21, 458, 184, 431; 136/263, 256; 429/111; 423/610

(56) References Cited

U.S. PATENT DOCUMENTS

| 5,482,570 A | * | 1/1996 | Saurer et al. ................ 136/255 |
| 5,525,440 A | * | 6/1996 | Kay et al. .................... 429/111 |
| 5,885,368 A | * | 3/1999 | Lupo et al. .................. 136/263 |
| 6,335,481 B1 | * | 1/2002 | Watanabe ..................... 136/263 |

FOREIGN PATENT DOCUMENTS

DE 19711713 A1 10/1998

OTHER PUBLICATIONS

Thelakkat et al., Poly(triarylamine)s–synthesis and application in electroluminecent devices and photovoltaics, Synthetic–Metals (Switzerland), vol. 102, No. 1–3, p. 1125–8, Jun. 1999.*

Vogel et al. *Sensitization of highly porous, polycrystalline TiO2 electrodes by quantum sized CdS*, Chemical Physics Letters, Nov. 9, 1990, pp. 241–246, vol. 174,No. 3,4, Elsevier Science.

O'Reagan et al. *A low–cost, high–efficiency solar cell based on dye–sensitized colloidal TiO2 films*, Letters to Nature, Oct. 24, 1991, vol. 353.

Vogel et al. *Quantum–Sized PbS, CdS, Ag2S, Sb2S3, and Bi2S3 Particles as Sensitzers for Various Nanoporous Wide–Bandgap Semiconductors*, J. Phys. Chem., 1994, pp. 3183–2188, vol. 98.

Greenham et al. *Charge separation and transport in conjugated–polymer/semiconductor–nanocrystal composites . . .* , Physical Review B., Dec. 15, 1996, pp. 628–637, vol. 54, No. 24.

(List continued on next page.)

*Primary Examiner*—Shouxiang Hu
(74) *Attorney, Agent, or Firm*—Clifford W. Browning; Woodard, Emhardt, Moriarty, McNett & Henry LLP

(57) ABSTRACT

A solid state p-n heterojunction comprising an electron conductor and a hole conductor; it further comprises a sensitising semiconductor, said sensitizing semiconductor being located at an interface between said electron conductor and said hole conductor. In particular, the sensitizing semiconductor is in form of quantum-dots. A solid state sensitized photovoltaic cell comprises such a layered heterojunction between two electrodes.

18 Claims, 3 Drawing Sheets

OTHER PUBLICATIONS

Siebentritt et al. *CdTe and CdS as Extremely Thin Absorber Materials in an ETA solar cell,* 14th European Photovoltaic Solar Energy Conference, Jun. 30, 1997, pp. 1823–1826, Barcelona, SP.

Salafsky et al. *Photoinduced charge separation and recombination in a conjugated polymer–semiconductor nanocrystal composite,* Chemical Physics Letters, Jul. 3, 1998, pp. 297–303, vol. 290, No. 4/06.

Rost et al, *Transparent P–Type Semiconductors for the eta Solar Cell . . . ,* 2nd Wrld. Conf. and Exh. on Photovoltaic Solar Energy Conversion, Jul. 6–10, 1998, pp. 212–215, Vienna, Austria.

Bach et al. *Solid–state dye–sensitized mesoporous TiO2 solar cells . . . ,* Letters to Nature, Oct. 8, 1998, pp. 583–585, vol. 395, MacMillan Journals Ltd., London.

Moller et al. *A novel disposition technique for compound semiconductors on highly porous substrates: ILGAR,* Thin Solid Films, Feb. 21, 2000, pp. 113–117, vol. 361/362, Elsevier–Sequoia.

Bach, U., *Solid–State Dye–Sensitized Mesoporous TiO2 Solar Cells,* Thesis presented to Ecole Polytechnique Federale de Lausanne, 2000, Lausanne, Switzerland.

* cited by examiner

- - Treated 1x (Integrated current from 340 to 800 is 1.4mA/cm$^2$)
——Treated 5x (Integrated current from 340 to 800 is 2.0mA/cm$^2$)
·····Treated 10x (Integrated current from 340 to 800 is 1.1 mA/cm$^2$)

SOLID STATE HETEROJUNCTION AND SOLID STATE SENSITIZED PHOTOVOLTAIC CELL

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

1. Field of the Invention

The present invention concerns a solid state p-n heterojunction, comprising an electon conductor and a hole conductor. The invention concerns also a solid state sensitized photovoltaic cell, in particular a solar cell.

2. Description of Related Art

The dye sensitized solar cells (DYSC), are more and more maturing into a technically and economically credible alternative to the conventional p-n junction photovoltaics. Photoelectrochemical (PEC) liquid junction cells based on the photosensitization of semiconductor $TiO_2$ layers with molecular sensitizers attracted renewed interest after Graetzel et al reported energy conversion efficiencies >10%, in Nature, 353 (1991) 737. In 1998, Graetzel et al reported in Nature, 395 (1998) 583, a more innovative all solid state cell based on a heterojunction sensitized by a molecular dye where an amorphous organic hole transport material replaced the liquid electrolyte.

The crucial part in these cells is the dye itself. Only a very limited number of dyes give high photocurrent quantum yields and are reasonably stable against photo-degradation. Some of the organic dyes exhibiting high light absorption are sensitive to air and water.

It is therefore a target of the present invention to propose photovoltaic cells having improved stability against photo-degradation and environmental influences. It is another target of the invention to achieve higher photocurrent quantum yields, higher photovoltages and hence higher conversion yields in the visible part of the light spectrum.

BRIEF SUMMARY OF THE INVENTION

These aims are achieved by means of a solid state p-n heterojunction comprising a solid electron conductor,—i.e. a n type semiconductor, and a hole conductor,—i.e. a p-type semiconductor, further comprising a sensitising semiconductor, said sensitising semiconductor being located at the interface between the electron conductor and the hole conductor.

For the purpose of sensitization, the sensitizing semiconductor shall be light absorbing in the visible and the near infrared parts of the light spectrum, preferably up to 950 nanometers (eq to 1.4 eV).

The sensitizing semiconductor maybe provided in form of a coating film at the surface of the electron conductor. This coating film is not necessarily continuous. Only a part of the surface of the electron conductor, i.e. a part of the surfaces of the pores of a porous electron conductor may be covered by coating portions.

The sensitizing semiconductor may be provided in form of particles adsorbed at the surface of the electron conductor. The term "particles" herein refers to particles of various sizes, below a nanometer, in the nanometer range, or bigger, but excludes single discrete molecules.

A preferred kind of particles of sensitizing semiconductor for providing a solid state p-n heterojunction according to the present invention are quantum-dots.

Thereby, a preferred object of the present invention is a new embodiment of a sensitized solar cell where the molecular sensitizer is replaced by a small semiconductor particle, referred to in scientific papers as "nano-dot" or "quantum dot" or "Q-dot". Quantum dots are semiconductor particles of nanometer size wherein a gradual translation from solid state to molecular structure occurs as the particle size decreases. The quantum dots are adsorbed at the heterojunction constituted by a n-type semiconductor and a p-type semiconductor.

Preferably, the n-type semiconductor is a finely divided and sintered large band gap ceramic oxide. Various metal oxides like $Ta_2O_5$, $Nb_2O_5$, $SnO_2$, $ZnO$ may be used as solid electronic conductors, whereas nanocrystalline $TiO_2$ (anatase) is preferred.

The hole conductor may be selected from hole transporting inorganic solids like copper iodide or copper thiocyanate. Typically, the hole conductor may be an organic charge transport material. This organic charge transport material may be a polymer, like poly-tiophen or poly-arylamin. The hole conductor of the present invention may also be an amorphous, reversibly oxidizable organic non-polymeric compound.

As such a compound, the hole conductor may be selected from the group consisting of spiro- and hetero spiro compounds of general formula (I)

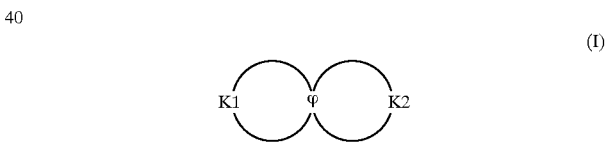

(I)

Wherein φ is one of C, Si, Ge or Sn, and K1 and K2 are, independently one of the other, conjugated systems. A particularly preferred hole conductor is 2,2',7,7'-tetrakis (N,N-di-p-methoxyphenyl-amine) 9,9'-spirobifluorene, herein further called OMeTAD.

As quantum dots, particles consisting of CdS, $Bi_2S_3$, $Sb_2S_3$, or $Ag_2S$ may be used, whereas PbS is preferred. Other compounds suitable for making quantum-dots are In As, InP, CdTe, CdSe, HgTe. Solid solutions of HgTe and CdTe or of HgSe and CdSe are also suitable.

A preferred quantum dot sensitized nanocrystalline heterojunction is constituted of sintered particles of nanocrystalline $TiO_2$ onto which PbS particles in the nanometer range are adsorbed as sensitizers, the pores between the particles being filed with amorphous OMeTAD.

The mesoscopic nature of the heterojunction results in a high contact area of the junction, which is prerequisite for efficient solar light harvesting by the quantum dots. Light is absorbed by the Q-dots and produces electron-hole pairs. The electrons are injected from the Q-dots into the electron conducting solid while the holes are injected in the hole conducting side of the junction. In this way electric power is produced from light.

While the sensitization of oxide semiconductors by Q-dots has already been reported for liquid junction cells by Vogel et al, in Chem. Phys. Lett., 174 (1990) 241, these devices show notorious problems with corrosion and photocorrosion of the Q-dots by the electrolyte, rendering them unsuitable for sensitization. The present invention realises a solid state heterojunction cell that does not present these disadvantages and hence can be used for the conversion of sunlight to electric power.

Quantum dot sensitized heterojunction cells offer several advantages. The band gaps and thereby the absorption ranges are adjustable through the particle size or by adjusting the relative concentrations of components in solid solutions like HgTe/CdTe or HgSe/CdSe. The band gap of these solutions may be adjusted to approach the optimal value for conversion of sunlight to electric power, which is about 1.4–1.5 eV.

Furthermore, compared to organic dyes, quantum dot sensitization offers improved stability, since the surface of the Q-dots can be modified to improve their photostability.

Another advantage is that the optical cross section of the Q-dots is significantly larger than the one of the molecular dyes. This allows to employ thinner films resulting in higher photovoltages as well as better fill factors of the cell, and hence higher conversion yields. Whereas only a limited number of molecular dyes suit the requirements of DYSC, Q-dot semiconductors have very high extinction coefficients and hence are very effective sensitizers. Since photo generated $e^-$ and $h^+$ can be separated effectively as in n-p junctions, quantum dot sensitization offers a means to combine the mechanical features, efficiency and weather-ruggedness of single crystalline or polycrystalline p-n photovoltaics with an excellent spectral range coverage.

BRIEF DESCRIPTION OF THE SEVERAL VIEWS OF THE DRAWINGS

Other features and advantages of the present invention will appear to those skilled in the art from the following description of an embodiment of a solid state sensitized photovoltaic cell, from the description of a process for making a solid state heterojunction and from measurements made with such a cell, in conjunction with the drawings, among which.

DETAILED DESCRIPTION OF THE INVENTION

Figures 1, 2:
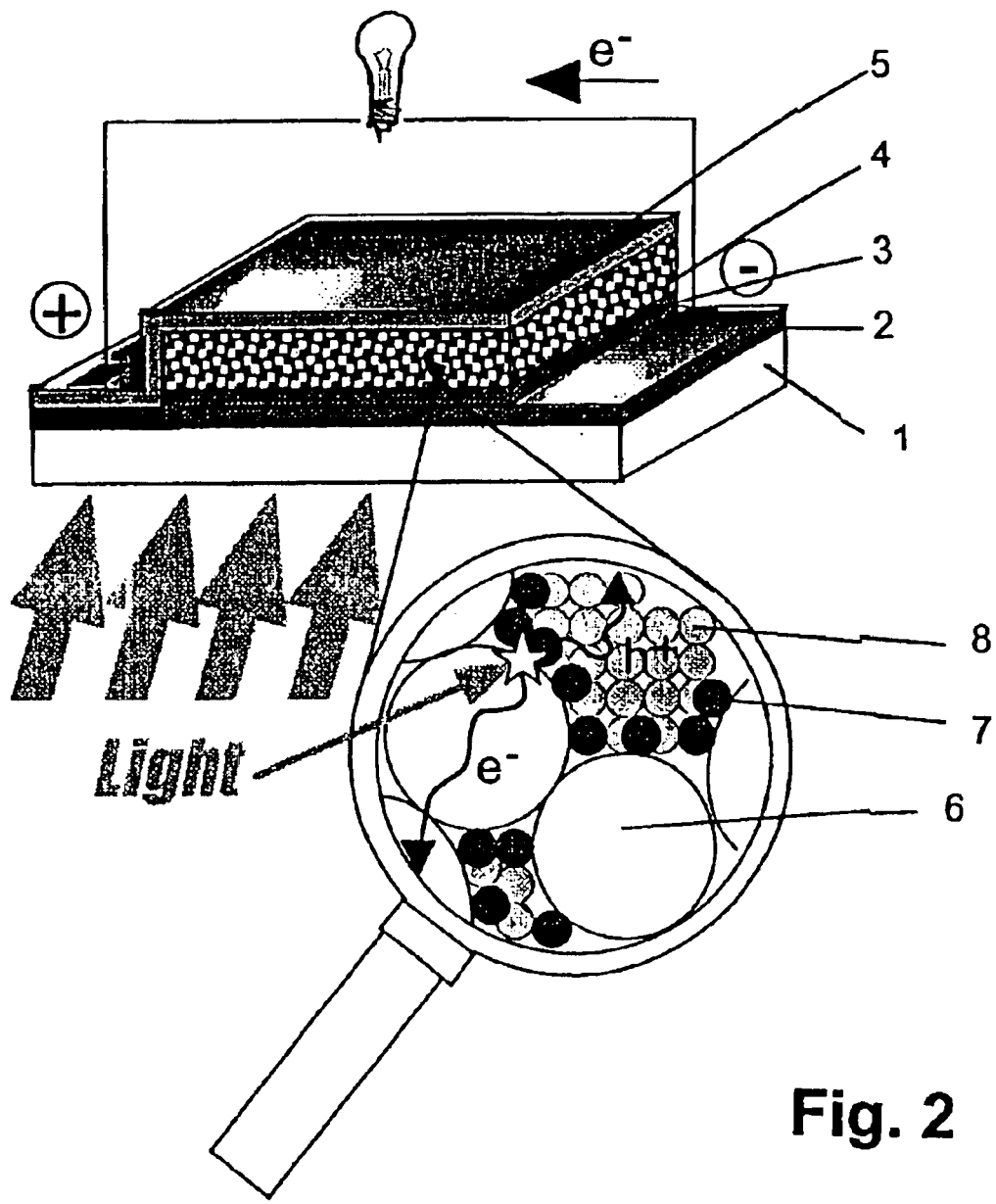
FIG. 1 shows a schematic view of a solid state sensitized photovoltaic cell.
FIG. 2 is an enlarged view of a heterojunction within the nanocrystalline $TiO_2$ layer.

FIG. 1 shows the schematic build up of a solid state sensitized photovoltaic cell. From bottom to top there are:
an ITO transparent glass support 1;
the glass support 1 is coated by a transparent conducting layer 2 made of F doped $SnO_2$, thereby the coated glass acts as a working electrode, which collects charge and current.
a dense $TiO_2$ layer 3 for avoiding direct contact between the organic hole conductor and the SnO2, which would short circuit the cell;
a quantum dot sensitized nanocrystalline layer 4, forming a heterojunction, which is build up as will be explained bellow;
the back contact 5 of the cell is made of a fine gold layer of 10 nanometers covered by a thick nickel layer for a better current collection.

FIG. 2 shows a magnified schematic view of the microscopic structure of the layered heterojunction: at the surface of $TiO_2$ particles 6, are adsorbed Q-dots 7; the spaces are filled with particles 8 of an organic hole conductor.

EXAMPLE

Process for Making a Layered Heterojunction

The compact $TiO_2$ layer is deposited on the $SnO_2$-coated glass by spray pyrolysis. This process is performed following the procedure described in the thesis No. 2187 at EPFL (Ecole Polytechnique Fédérale de Lausanne) of Udo Bach. The nanoporous $TiO_2$ layer is deposited by screen printing. The plates are thereafter sintered at a temperature of 450° C. for 15 min. This results in a layer with a thickness of about 2 $\mu$m. The plates are thereafter stored in water free atmosphere.

The technique used to deposit the Q-dots follows the procedure published by Weller et al in J. Phys. Chem. 98, 1994, 3183. Two solutions are needed for this technique, the first one is a saturated $Pb(NO_3)_2$ solution in water, and the second one a 0.3M $Na_2S$ solution in water. The plates are immersed for 1 minute in the first solution. Thereafter, they are rinsed with water and dipped into the second solution for about 10 sec and then rinsed again. This deposition procedure may be repeated several times.

After the deposition of the Q-dots, the hole-conductor is introduced into the pores of the nanocrystalline structure by spin-coating. The spin-coating solution is a 30% by weight solution of OMeTAD in chlorobenzene. The OMeTAD may be doped with 0.2% of $OMeTAD^-$. An amount of 15 $\mu$l of spin-coating solution is used for each plate. Subsequently, the solvent is evaporated.

A semi-transparent gold back contact is evaporated on top of the heterojunction layer under vacuum. A second contact layer made of nickel is sprayed onto the first one.

Figure 3:
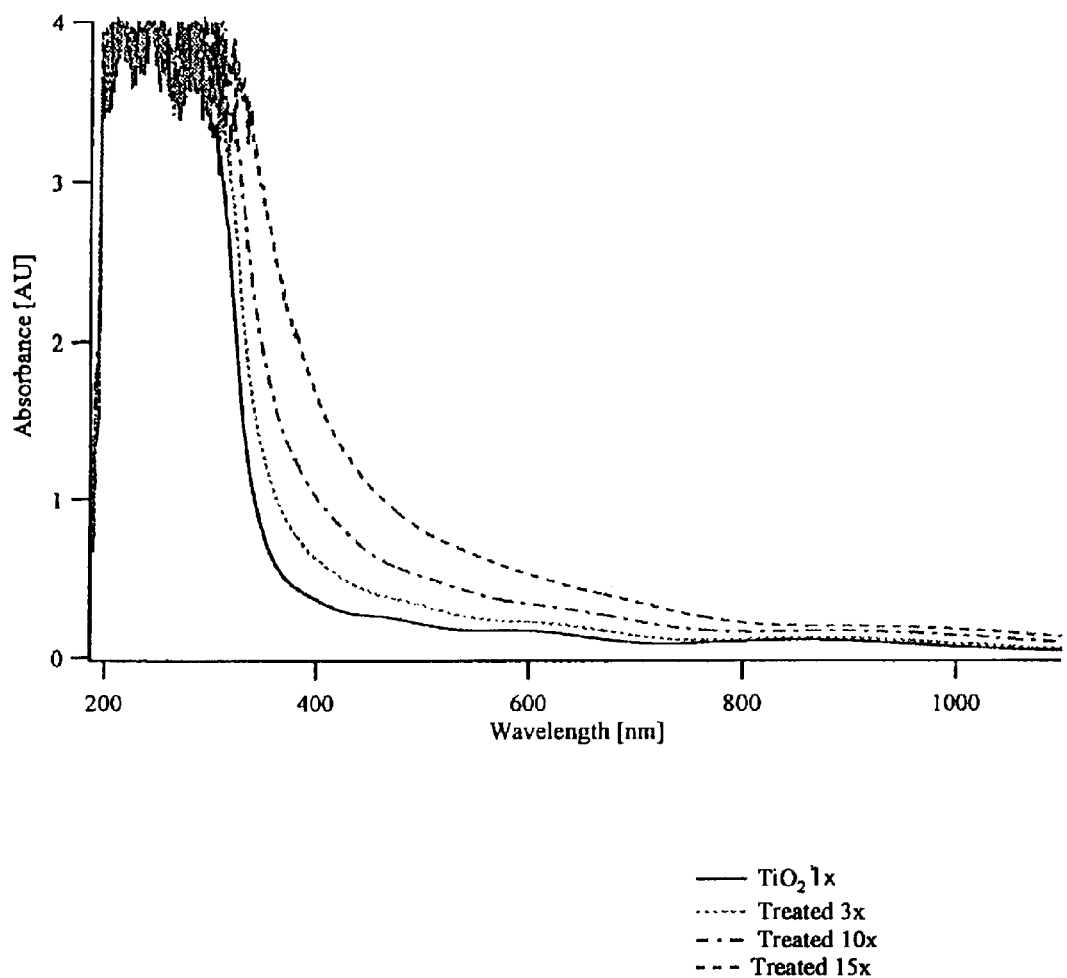
FIG. 3 shows absorption spectra of $TiO_2$ plates with different deposition treatments.

Absorption spectra are measured with a Hewlett-Packard 8453 spectrometer and are shown in FIG. 3. FIG. 3 shows that repeating the Q-dot deposition treatment results in an increase of the visible absorption of the electrode. With each deposition, the optical density increases and the electrode becomes strongly colored. The Q-dots are getting bigger with each treatment.

Figure 4:
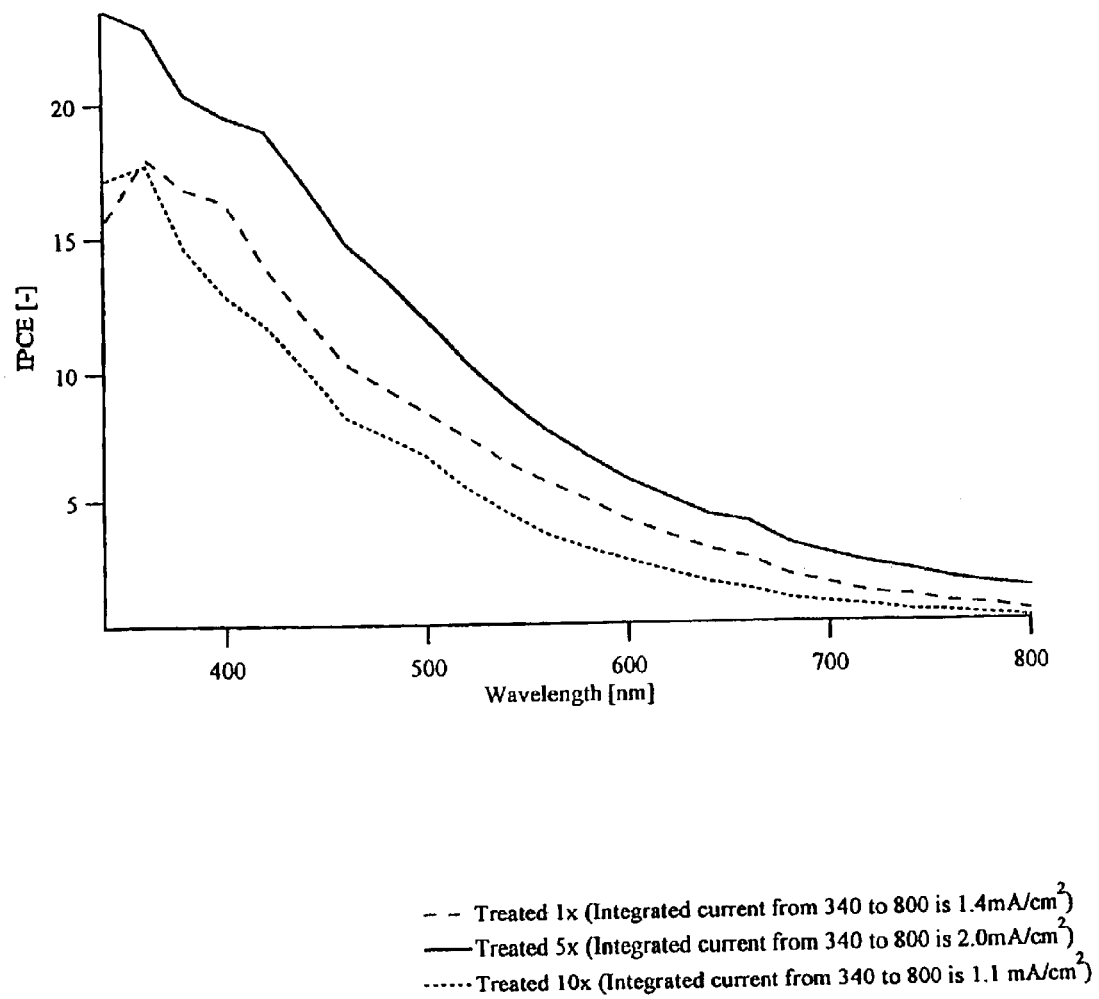
FIG. 4 shows the photo current generation efficiency as a function of wavelength for Q-dot sensitized solid state heterojunction solar cells.

FIG. 4 shows the wavelength response of the photocurrent produced by the device. The incident photon to current conversion efficiency (IPCE) is plotted as a function of the wavelength of the monochromatic light. The conversion yields are high, exceeding 10 percent in the visible. This proves that the sensitization of the heterojunction by the quantum dots functions well.

From these measurements, it can be seen that there is an optimum in the number of times the deposition treatment is repeated. For this embodiment, if only one treatment is done, there is not enough Q-dots formed on the $TiO_2$ surface. On the other hand, if there are too many deposition treatments, typically 10, as shown in FIG. 4, the Q-dots get too big and the efficiency drops.

What is claimed is:
1. A solid state p-n heterojunction consisting of an n-type semiconductor in the solid state, a p-type semiconductor in the solid state and a sensitizing semiconductor, said sensitizing semiconductor consisting of individual particles adsorbed at the surface of said n-type semiconductor, said individual particles being quantum dots, with a plurality of individual point-contact junctions between said quantum dots and said n-type semiconductor and between said quantum dots and said p-type semiconductor wherein said solid state p-n heterojunction is obtained by forming said quantum dots in the nanometer range on the surface of said n-type semiconductor by more than one deposition treatment and less than 10 deposition treatments, before providing said p-type semiconductor to form said solid state p-n heterojunction.

2. A heterojunction as claimed in claim 1, characterised in that said n-type semiconductor is a ceramic made of finely divided large band gap metal oxide.

3. A heterojunction as claimed in claim 1, characterised in that said n-type semiconductor is nanocrystalline $TiO_2$.

4. A heterojunction as claimed in claim 1, characterised in that said p-type semiconductor is an inorganic hole transporting solid compound.

5. A heterojunction as claimed in claim 1, characterised in that said p-type semiconductor is an amorphous reversibly oxydisable organic or organometallic compound.

6. A heterojunction as claimed in claim 1, characterised in that said p-type semiconductor is a polymer.

7. A heterojunction as claimed in claim 1, characterised in that said p-type semiconductor is selected from the group consisting of Spiro and Heterospirocompounds of general formula (I),

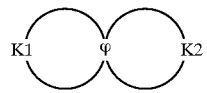

(I)

wherein φ is one of C, Si, Ge or Sn, and K1 and K2 are independently one from the other conjugated systems.

8. A heterojunction as claimed in claim 7, wherein said p-type semiconductor is OMeTAD.

9. A heterojunction as claimed in claim 1, wherein said quantum dots are particles consisting of PbS, CdS, $Bi_2S_3$, $Sb_2S_3$, $Ag_3S$, InAs, InP, CdTe, CdSe or HgTe or solid solutions of HgTe/CdTe or HrSe/CdSe.

10. A solid state sensitized photovoltaic cell comprising a solid state p-n heterojunction consisting of an n-type semiconductor in the solid state, a p-type semiconductor in the solid state and a sensitizing semiconductor, said sensitizing semiconductor consisting of individual particles adsorbed at the surface of said n-type semiconductor, said individual particles being quantum dots, with a plurality of individual point-contact junctions between said quantum dots and said n-type semiconductor and between said quantum dots and said p-type semiconductor wherein said solid state p-n heterojunction is obtained by forming said quantum dots in the nanometer range on the surface of said n-type semiconductor by more than one deposition treatment and less than 10 deposition treatments, before providing said p-type semiconductor to form said solid state p-n heterojunction.

11. A cell as claimed in claim 10, characterised in that it comprises
a transparent first electrode,
said solid state p-n heterojunction
a second electrode, and further comprises a dense semiconductive layer between said first electrode and said solid state p-n heterojunction.

12. A cell as claimed in claim 10, characterized in that said n-type semiconductor is a ceramic made of finely divided large band gap metal oxide.

13. A cell as claimed in claim 10, characterized in that said n-type semiconductor is nanocrystalline $TiO_2$.

14. A cell as claimed in claim 10, characterized in that said p-type semiconductor is a polymer.

15. A cell as claimed in claim 10, characterized in that said p-type semiconductor is an amorphous reversibly oxydisable organic or organometallic compound.

16. A cell as claimed in claim 10, characterized in that said p-type semiconductor is selected from the group consisting of Spiro and Heterospirocompounds of general formula (I),

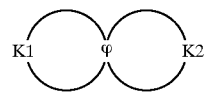

(I)

wherein φ is one of C, Si, Ge or Sn, and K1 and K2 are independently one from the other conjugated systems.

17. A cell as claimed in claim 10, wherein said p-type semiconductor is OMeTAD.

18. A cell as claimed in claim 10, wherein said quantum dots are particles consisting of PbS, CdS, $Bi_2S_3$, $Sb_2S_3$, $Ag_2S$, InAs, InP, CdTe, CdSe or HgTe or solid solutions of HgTe/CdTe or HgSe/CdSe.

* * * * *

UNITED STATES PATENT AND TRADEMARK OFFICE
CERTIFICATE OF CORRECTION

PATENT NO. : 6,861,722 B2
DATED : March 1, 2005
INVENTOR(S) : Michael Graetzel, Robert Plass and Udo Bach It is certified that error appears in the above-identified patent and that said Letters Patent is hereby corrected as shown below:

Column 5,
Line 7, between "semiconductor" and "wherein" please insert -- , --;
Line 44, please delete "$Ag_3S$" and insert in lieu thereof -- $Ag_2S$ --;

Column 6,
Line 6, between "semiconductor" and "wherein" please insert -- , --.

Signed and Sealed this

Twenty-fourth Day of May, 2005

JON W. DUDAS
*Director of the United States Patent and Trademark Office*